(12) United States Patent
Demidov et al.

(10) Patent No.: US 8,566,477 B2
(45) Date of Patent: *Oct. 22, 2013

(54) REAL-TIME MULTI-BLOCK LOSSLESS RECOMPRESSION

(75) Inventors: Lilia Demidov, Ness-Tziona (IL); Nir Halowani, Holon (IL); Ori Shalev, Kiryat Ono (IL)

(73) Assignee: International Business Machines Corporation, Armonk, NY (US)

(*) Notice: Subject to any disclaimer, the term of this patent is extended or adjusted under 35 U.S.C. 154(b) by 68 days.

This patent is subject to a terminal disclaimer.

(21) Appl. No.: 13/282,987

(22) Filed: Oct. 27, 2011

(65) Prior Publication Data

US 2012/0045139 A1 Feb. 23, 2012

Related U.S. Application Data

(63) Continuation of application No. 13/044,396, filed on Mar. 9, 2011.

(60) Provisional application No. 61/312,358, filed on Mar. 10, 2010.

(51) Int. Cl.
*G06F 15/16* (2006.01)

(52) U.S. Cl.
USPC ........... 709/247; 709/246; 709/223; 382/232; 382/233

(58) Field of Classification Search
USPC ........ 709/246–247, 223; 375/240.03, 240.25; 382/232, 233
See application file for complete search history.

(56) References Cited

U.S. PATENT DOCUMENTS

| | | | | |
|---|---|---|---|---|
| 5,768,481 A * | 6/1998 | Chan et al. | ............. | 375/240.11 |
| 5,825,424 A * | 10/1998 | Canfield et al. | ......... | 375/240.15 |
| 6,023,295 A * | 2/2000 | Pau | ........................ | 375/240.04 |
| 6,112,250 A * | 8/2000 | Appelman | .................... | 709/247 |
| 6,222,886 B1 * | 4/2001 | Yogeshwar | ............. | 375/240.03 |
| 6,256,347 B1 * | 7/2001 | Yu et al. | ................... | 375/240.13 |
| 6,385,656 B1 | 5/2002 | Appelman | | |
| 6,438,168 B2 * | 8/2002 | Arye | ........................ | 375/240.03 |
| 6,594,315 B1 * | 7/2003 | Schultz et al. | ........... | 375/240.25 |
| 6,795,211 B1 * | 9/2004 | Eschbach et al. | .............. | 358/1.2 |
| 6,850,650 B1 | 2/2005 | Bauschke et al. | | |
| 7,092,965 B2 * | 8/2006 | Easwar | ......................... | 382/232 |
| 7,397,959 B1 * | 7/2008 | Volkoff et al. | ................ | 382/233 |
| 2004/0160625 A1 | 8/2004 | Kondo | | |
| 2005/0111747 A1 * | 5/2005 | Bauschke et al. | ............. | 382/251 |
| 2005/0163214 A1 | 7/2005 | Yachida | | |
| 2005/0270574 A1 | 12/2005 | Saito et al. | | |
| 2006/0104526 A1 | 5/2006 | Gringeler et al. | | |
| 2010/0020883 A1 | 1/2010 | Miyauchi et al. | | |
| 2010/0325523 A1 * | 12/2010 | Slyz et al. | .................... | 714/773 |

\* cited by examiner

*Primary Examiner* — Philip B Tran
(74) *Attorney, Agent, or Firm* — Griffiths & Seaton PLLC

(57) ABSTRACT

Exemplary methods, computer systems, and computer program products for processing a previously compressed data stream in a computer environment are provided. In one embodiment, the computer environment is configured for separating a previously compressed data stream into an input data block including a header input block having a previously compressed header. Sequences of bits are included with the input data block. Compression scheme information is derived from the previously compressed header. The input data block is accessed and recompressed following the header input block in the previously compressed data stream one at a time using block-image synchronization information. Access to the block-image synchronization information is initialized by the compression scheme information to generate an output data block. The block-image synchronization information is used to provide decompression information to facilitate decompression of the results of the output data block.

24 Claims, 17 Drawing Sheets

750

HUFFMAN - LUMINANCE (Y)-AC

| LENGTH | BITS | CODE |
| --- | --- | --- |
| 2 BITS | 00 | 01 |
| | 01 | 02 |
| 3 BITS | 100 | 03 |
| 4 BITS | 1010 | 11 |
| | 1011 | 04 |
| | 1100 | 00 (END OF BLOCK) |
| 5 BITS | 1101 0 | 05 |
| | 1101 1 | 21 |
| | 1110 0 | 12 |
| 6 BITS | 1110 10 | 31 |
| | 1110 11 | 41 |
| ... | ... | ... |
| 12 BITS | ... | ... |
| | 1111 1111 0011 | F0 (ZRL) |
| | ... | ... |
| | ... | ... |
| | ... | ... |
| | 1111 1111 1111 1110 | FA |
| 16 BITS | | |

FIG. 7B

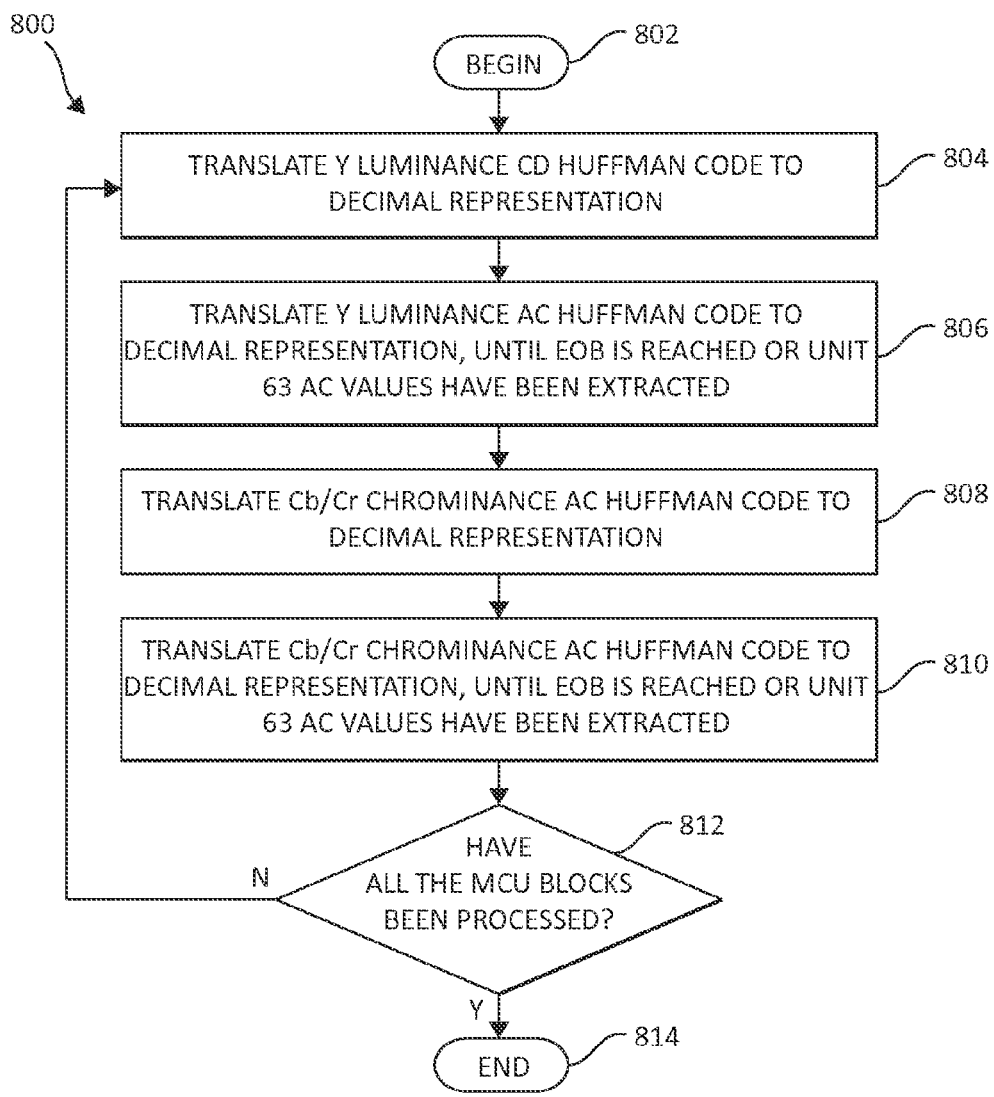

1200

| 20 | -10 | 2  | 2 | -1 | 0 | 0 | 0 |
|----|-----|----|---|----|---|---|---|
| 11 | -9  | -4 | 3 | 0  | 0 | 0 | 0 |
| 1  | -8  | 2  | 0 | 0  | 0 | 0 | 0 |
| -1 | 1   | 0  | 0 | 0  | 0 | 0 | 0 |
| 0  | -1  | 0  | 0 | 0  | 0 | 0 | 0 |
| 0  | 0   | 0  | 0 | 0  | 0 | 0 | 0 |
| 0  | 0   | 0  | 0 | 0  | 0 | 0 | 0 |
| 0  | 0   | 0  | 0 | 0  | 0 | 0 | 0 |

| LENGTH | BITS | CODE |
|--------|------|------|
| 3 BITS | 000  | 04 |
|        | 001  | 05 |
|        | 010  | 03 |
|        | 011  | 02 |
|        | 100  | 06 |
|        | 101  | 00 (END OF BLOCK) |
| 4 BITS | 1110 | 07 |
| 5 BITS | 1111 0 | 08 |
| 6 BITS | 1111 10 | 09 |
| 7 BITS | 1111 110 | 0A |
| 8 BITS | 1111 1110 | 0B |

| LENGTH | BITS | CODE |
|---|---|---|
| 2 BITS | 00 | 01 |
| | 01 | 02 |
| 3 BITS | 100 | 03 |
| 4 BITS | 1010 | 11 |
| | 1011 | 04 |
| | 1100 | 00 (END OF BLOCK) |
| 5 BITS | 1101 0 | 05 |
| | 1101 1 | 21 |
| | 1110 0 | 12 |
| 6 BITS | 1110 10 | 31 |
| | 1110 11 | 41 |
| ... | ... | ... |
| 12 BITS | ... | ... |
| | 1111 1111 0011 | F0(ZRL) |
| | ... | ... |
| ... | ... | ... |
| 16 BITS | ... | ... |
| | 1111 1111 1111 1110 | FA |

| LENGTH | BITS | CODE |
|---|---|---|
| 2 BITS | 00 | 01 |
| | 01 | 00 (END OF BLOCK) |
| 3 BITS | 100 | 02 |
| | 101 | 03 |
| 4 BITS | 1100 | 04 |
| | 1101 | 05 |
| | 1110 | 06 |
| 5 BITS | 1111 0 | 07 |
| 6 BITS | 1111 10 | 08 |
| 7 BITS | 1111 110 | 09 |
| 8 BITS | 1111 1110 | 0A |
| 9 BITS | 1111 1111 0 | 0B |

| LENGTH | BITS | CODE |
|---|---|---|
| 2 BITS | 00 | 01 |
| | 01 | 00 (END OF BLOCK) |
| 3 BITS | 100 | 02 |
| | 101 | 11 |
| 4 BITS | 1100 | 03 |
| 5 BITS | 1101 0 | 04 |
| | 1101 1 | 21 |
| 6 BITS | 1110 00 | 12 |
| | 1110 01 | 31 |
| | 1110 10 | 41 |
| ... | ... | ... |
| | ... | ... |
| 9 BITS | 1111 1100 0 | F0(ZRL) |
| | ... | ... |
| | ... | ... |
| 16 BITS | | |
| | 1111 1111 1111 1110 | FA |

| DC CODE | SIZE | ADDITIONAL BITS | DC VALUE |
|---|---|---|---|
| 00 | 0 |  | 0 |
| 01 | 1 | 0  1 | -1  1 |
| 02 | 2 | 00,01  10,11 | -3,-2  2,3 |
| 03 | 3 | 000,001,010,011  100,101,110,111 | -7,-6,-5,-4  4,5,6,7 |
| 04 | 4 | 0000....,0111  1000,...,1111 | -15,...,-8  8,...,15 |
| 05 | 5 | 0 0000,... ...,1 1111 | -31,000,-16  16,...,31 |
| 06 | 6 | 00 0000,... ...  11 1111 | -63,...,-32  32,...,63 |
| 07 | 7 | 000 0000,... ...,111 1111 | -127,...,-64  64,...,127 |
| 08 | 8 | 0000 0000,... ...,1111 1111 | -255,...,-128  128,...,255 |
| 09 | 9 | 0 0000 0000,... ...,1 1111 1111 | -511,...,-256  256,...,511 |
| 0A | 10 | 00 0000 0000,... ...,11 1111 1111 | -1023,...,-512  512,...,1023 |
| 0B | 11 | 000 0000 0000,... ...,111 1111 1111 | -2047,...,-1024  1024,...,2047 |

| BITS | 1111 1100 1111 | 110 0010 1010 1111 1110 1111 1111 0011 0001 |
|------|----------------|---------------------------------------------|
|      | 1111 1         | 0101 0111 1111                              |
| MCU  | 1              |                                             |
| COMPONENT | Y         |                                             |
| AC/DC | DC            |                                             |
| VALUE | -512          |                                             |

| BITS | 1111 1100 1111 | 110 0010 1010 1111 1110 1111 1111 0011 0001 1110 |
|------|----------------|--------------------------------------------------|
|      | 1111 1         | 0101 0111 1111                                   |
| MCU  | 1              |                                                  |
| COMPONENT | Y         |                                                  |
| AC/DC | DC            | AC                                               |
| VALUE | -512          | 0                                                |

| BITS | 1111 1100 1111<br>1111 1 | 110 0010 1010 1111 1110 1111 1111 0011 0001 1110 01 01<br>0101 0111 1111 |
|---|---|---|
| MCU | 1 | |
| COMPONENT | Y | Cb |
| AC/DC | DC | AC DC AC |
| VALUE | -512 | 0 0 0 |

| BITS | 1111 1100 1111<br>1111 1 | 110 0010 1010 1111 1110 1111 1111 0011 0001 1110 01 01 01 01<br>0101 0111 1111 |
|---|---|---|
| MCU | 1 | |
| COMPONENT | Y | Cb    Cr |
| AC/DC | DC | AC DC AC DC AC |
| VALUE | -512 0 | 0  0  0  0 |

FIG. 15D

REAL-TIME MULTI-BLOCK LOSSLESS RECOMPRESSION

CROSS-REFERENCE TO RELATED APPLICATION

This application is a Continuation of U.S. patent application Ser. No. 13/044,396, which was filed on Mar. 9, 2011, which claims the benefit under 35 U.S.C. §119(e) of U.S. Provisional Application No. 61/312,358, filed Mar. 10, 2010, both of which are incorporated herein by reference.

BACKGROUND OF THE INVENTION

1. Field of the Invention

The present invention relates generally to computers, and more particularly, to processing a previously compressed data stream and more particularly to recompression thereof.

2. Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. The disk drives may be configured in an array, such as a Redundant Array of Independent Disks (RAID) topology, to provide data security in the event of a hardware or software failure. The data storage systems may be connected to a host, such as a mainframe computer. The disk drives in many data storage systems have commonly been known as Direct Access Storage Devices (DASD). DASD devices typically store data on a track, which is a circular path on the surface of a disk on which information is recorded and from which recorded information is read.

In recent years, both software and hardware technologies have experienced amazing advancement. With the new technology, more and more functions are added and greater convenience is provided for use with these electronic appliances. One of the most noticeable changes introduced by recent computer technology is the inclusion of images, video, and audio to enhance the previous text-only user interfaces. In the age of multimedia, the amount of information to be processed increases greatly. One popular method of handling large data files is to compress the data for storage or transmission. Therefore, processing very large amounts of information is a key problem to solve. One example of compressing data or images is the JPEG (Joint Photographic Experts Group) standard that allows for the interchange of images between diverse applications and open up the capability to provide digital continuous-tone color ac images in anti-media applications. The JPEG standard has been fully generalized to perform regardless of image content and to accommodate a wide variety of data compression demands. Therefore, encoders and decoders employing the JPEG standard in one or more of several versions have come into relatively widespread use and allow wide access to images for a wide variety of purposes. Moreover, other compression format methods have been used to meet the data compression demands.

SUMMARY OF THE DESCRIBED EMBODIMENTS

With increasing demand for faster, more powerful and more efficient ways to store information, optimization of storage technologies is becoming a key challenge. Logical data objects (data files, image files, data blocks, etc.) may be compressed for transmission and/or storage. Data compression techniques are used to reduce the amount of data to be stored and/or transmitted in order to reduce the storage capacity and/or transmission time respectively. Compression may be achieved by using different compression algorithms known in the art, for example, by sequential data compression, which takes a stream of data as an input and generates a usually shorter stream of output from which the original data can be restored.

Pictorial and graphics images contain extremely large amounts of data. If the pictorial and graphics images are digitized to allow transmission or processing by digital data processors, such processing often requires many millions of byte to represent respective pixels of the pictorial or graphics image with quality fidelity. The purpose of image compression is to represent images with less data in order to save storage costs or transmission time and costs. For example, one example of compressing data/images involves the use of JPEG, which was developed by the Joint Photographic Experts Group and standardized in 1992, and is currently the most widely used compressed image format. Due to their already compressed nature, universal compression algorithms like Deflate, ZLIB, LZ cannot reduce the size of JPEG compressed files any further.

JPEG is primarily concerned with images that have two spatial dimensions, contain gray scale or color information, and possess no temporal dependence, as distinguished from the MPEG (Moving Picture Experts Group) standard. JPEG compression can reduce the storage requirements by more than an order of magnitude and improve system response time in the process. A primary goal of the JPEG standard is to provide the maximum image fidelity for a given volume of data and/or available transmission or processing time and any arbitrary degree of data compression is accommodated. It is often the case that data compression by a factor of twenty or more (and reduction of transmission time and storage size by a comparable factor) will not produce artifacts or image degradation which are noticeable to the average viewer.

Accordingly, and in view of the foregoing, various exemplary methods, computer systems, and computer program products for processing a previously compressed data stream in a computer environment are provided. In one embodiment, the computer environment is configured for separating a previously compressed data stream into an input data block including a header input block having a previously compressed header. Sequences of bits are included with the input data block. Compression scheme information is derived from the previously compressed header. The input data block is accessed and recompressed following the header input block in the previously compressed data stream one at a time using block-image synchronization information. Access to the block-image synchronization information is initialized by the compression scheme information to generate an output data block. The block-image synchronization information is used to provide decompression information to facilitate decompression of the results of the output data block. The decompression information is stored in the at least one output block.

In addition to the foregoing exemplary embodiment, various other system and computer program product embodiments are provided and supply related advantages.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which:

FIG. 7B is a diagram of an exemplary Huffman binary tree built using the method of FIG. 7A;

FIG. 8 is a flowchart illustrating an exemplary method for performing the DCT data section extraction step as mentioned in FIG. 4;

FIG. 9 is a table presenting a standard previously compressed file encoding scheme and expected coding scheme for 3-component scan data, for each Minimum Coded Unit (MCU), with no chroma subsampling;

FIG. 12 is a block diagram illustrating an exemplary diagram of a DCT matrix from a single MCU (8×8 pixel square) in a digital photo;

FIG. 13A is a Huffman code translation Table storing example Huffman—Luminance (Y)—DC values;

FIG. 13B is a Huffman code translation table storing example Huffman—Luminance (Y)—AC values;

FIG. 13C is a Huffman code translation table storing example Huffman—Chrominance (Cb & Cr)—DC values;

FIG. 13D is a Huffman code translation table storing example Huffman—Chrominance (Cb & Cr)—AC values;

FIG. 14 is an example bit field-decimal equivalent conversion table;

FIGS. 15A-15D are tables showing progression through an example encoding/writing work session using the method of FIG. 4.

DETAILED DESCRIPTION OF THE DRAWINGS

Figure 1:
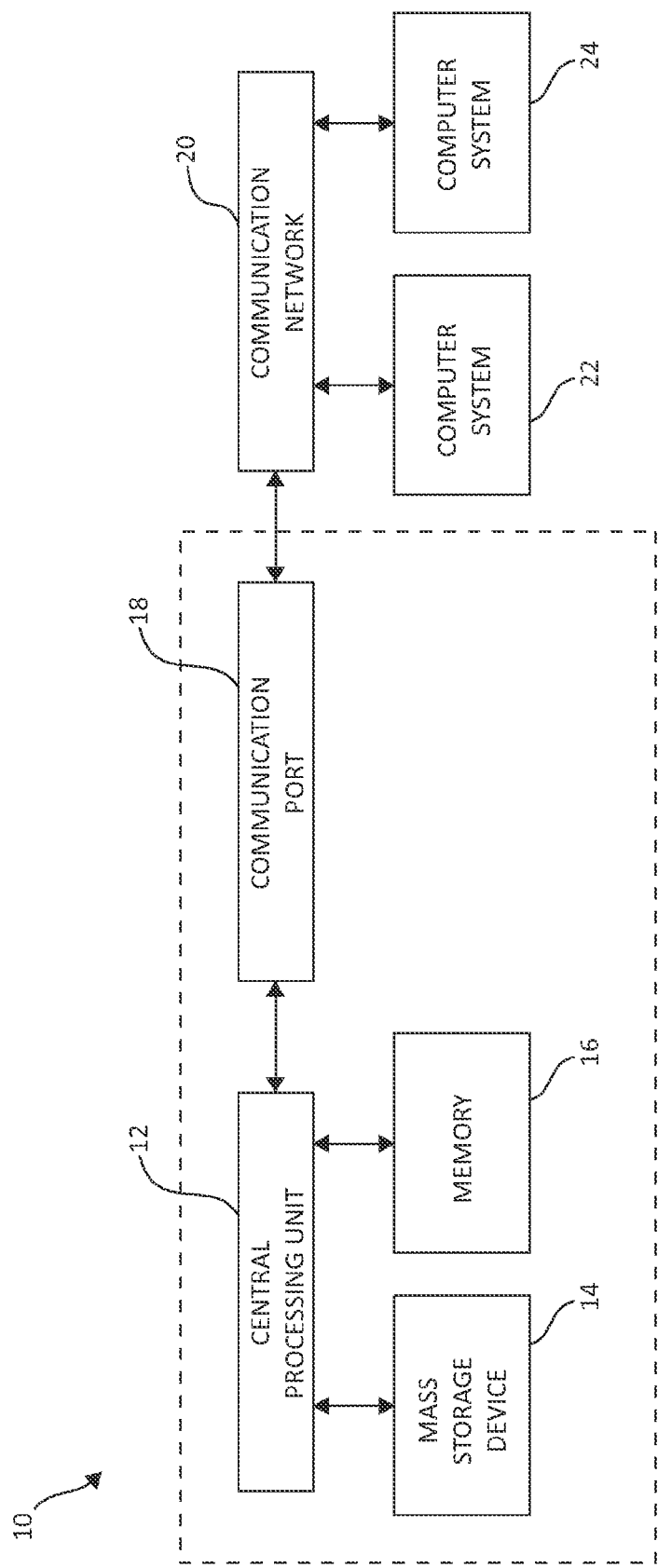
FIG. 1 illustrates a computer system environment having an exemplary storage device in which aspects of the present invention may be realized.

Throughout the following description and claimed subject matter, the following terminology, pertaining to the illustrated embodiments, is described. The definitions may form a table of suitable of definitions, form matrices for suitable purposes, if needed, and for certain terms used herein.

A "JPEG" is intended herein to include any type of compression which includes Color space transformation, Down-sampling, Block splitting, Discrete cosine transform (DCT) using extracted DCT coefficients as described herein, Quantization and Entropy coding, such as but not limited to compression in accordance with the classical JPEG protocol. The term JPEG may include a variety of compression format methods and should not be limited to the classical JPEG protocol.

"Compression scheme information" is also termed herein "initialization information" and may for example include Huffman tables. This information indicates the actual scheme by which a first, larger number of bits representing an image are replaced by a second, smaller number of bits representing the same image at a lower but still acceptable quality.

In the present specification, the terms "Huffman table", "Huffman code translation table" and "Huffman code table" are used generally interchangeably.

"Block-image synchronization information" is also termed herein "sequence interpretation information" and may include an indication that, for example, the first bit in a particular input block is the cb component (say) of a particular pixel in a particular row of a particular image.

Typically, the block-image synchronization information comprises an indication of how to synchronize the input data block to a known repeating structure of the data in the input data block (e.g. the "DCT data section" in the input blocks). In one embodiment, by way of example only, the known repeating structure may comprise for each pixel in each column in each row in each image, a set of bits (typically 8×8 bits) pertaining to a y component, followed by a set of bits (typically 8×8 bits) pertaining to a cb component, followed by a set of bits (typically 8×8 bits) pertaining to a cr component. The indication may comprise an indication of whether the first bit in the input data block belongs to a y matrix, a cb matrix or a cr matrix and the location of the first bit within the matrix. Typically, DCT transform coefficients are stored as respective entries of a Huffman matrix. Each Huffman table typically is associated with a single component (y, cb or cr) of a single pixel (P). In the art of digital imaging, Y-Cb-Cr is a color coordinate scheme used to encode pixel color, wherein Y typically represents a luma component, and Cb and Cr represent the blue and red chroma components, respectively. In other words, Y is the brightness (luma), Cb is blue minus luma (B−Y) and Cr is red minus luma (R−Y).

The term "resource state" is sometimes used to refer to information useful for previously compressed file/data recompression (e.g., a JPEG recompression) including compression scheme information and block-image synchronization information. This information may reside in, and be accessed from, an external memory device during encoding and during decoding, and may reside in and be accessed from each output block to be decoded.

The term "DC Huffman Translation Codes" (DHT) typically refers to a Huffman code translation table, which enables extraction of DC Value, as per DHT entries.

"DHT entries" appear in a previously compressed file and define the number of codes for each bit-string length, followed by a sequence of all the code words.

"Writing" refers to encoding, including recompression of previously compressed files/data.

"Reading" refers to a decompression/reconstruction process in which re-compressed previously compressed file/data is de-coded.

An "Input block" refers to a previously compressed block to be re-compressed, e.g. input block by input block, as shown and described herein.

An "Output block" refers to a previously compressed re-compressed block to be de-compressed output block by output block, as shown and described herein.

Each of the terms describe herein may be construed either in accordance with any definition thereof appearing in prior art literature or in accordance with the specification, or as defined within the herein.

Image files are usually stored in a compressed format to reduce the size of the storage footprint. The raw size of the image files is relatively large compared to the compressed format. The common approach is to compress large images using lossy compression, such as a standardized JPEG format. In this approach some of the image details are lost, but the image quality remains similar to the human eye. The current image compression algorithms use non-sophisticated methods. These methods may enable achieving a lower compression ratio. However, it is often times impossible to improve the image compression ratio in the storage array due to many problems, such as, the storage array needs to maintain bit-to-bit compatibility and cannot use lossy compression or recompress the image data using another algorithm. Another limitation is the data written to the storage is in progressive mode so each time the storage receives only part of the image so encoding information is not retained between blocks. Using a standard compression algorithm that is unaware of the image content will not achieve any additional compression ratio. Using a dedicated format compression algorithm that is unaware to storage progressive mode will not achieve any additional compression ratio as block image synchronization info is lost.

The mechanisms of the illustrated embodiments offer a new approach to increase the compression ratio of already compressed image(s)/files written to the storage in progressive mode. The approach maintains the bit-to-bit binary compatibility of the original compressed image file and enables random access read of the compressed blocks while increasing the compression ratio. The mechanisms of the illustrated embodiments do not use any lossy compression algorithms.

In one embodiment, the mechanisms of the illustrated embodiments detect the image components and evaluate their compression method used. The components that use non-efficient compression are than decoded. A common denominator is defined from the decoded components and apply prediction algorithms to each set. The needed image synchronization information is identified and retained for all preceding blocks. The image synchronization information is retained in each compressed block to enable random access read of compressed blocks from storage array. The mechanisms of the illustrated embodiments may be applied in real-time to progressive storage write and may be implemented in the storage array.

It should be noted and observed that there may be three basic types of storage architectures to consider in connection with methods of data access: Block Access, File Access, and Object Access. In block mode access architecture, the communication between a server/client and a storage medium occurs in terms of blocks; information is pulled block by block directly from the disk. The operation system keeps track of where each piece of information is on the disk, while the storage medium is usually not aware of the file system used to organize the data on the device. When something needs to get read or be written, the data are directly accessed from the disk by that processor which knows where each block of data is located on the disk and how to put them together. Examples of block mode access storage technologies are DAS (Direct Attached Storage), SAN (Storage Area Network), Block Storage over IP (e.g. FCIP, iFCP, iSCSI, etc.), intra-memory storage, etc.

File access requires the server or client to request a file by name, not by physical location. As a result, a storage medium (external storage device or storage unit within computer) is usually responsible to map files back to blocks of data for creating, maintaining and updating the file system, while the block access is handled "behind the scene". The examples of file access storage technologies are NAS (Network Attached Storage with NFS, CIFS, HTTP, etc. protocols), MPFS (Multi-Pass File Serving), intra-computer file storage, etc. The file access storage may be implemented, for example, for general purpose files, web applications, engineering applications (e.g. CAD, CAM, software development, etc.), imaging and 3D data processing, multi-media streaming, etc.

Object access further simplifies data access by hiding all the details about block, file and storage topology from the application. The object access occurs over API integrated in content management application. The example of object access storage technology is CAS (Content Addressed Storage).

More efficient use of storage may be achieved by data compression before it is stored. Data compression techniques are used to reduce the amount of data to be stored or transmitted in order to reduce the storage capacity and transmission time respectively. Compression may be achieved by using different compression algorithms, for instance, a standard compression algorithm. It is important to perform compression transparently, meaning that the data can be used with no changes to existing applications. In either case, it is necessary to provide a corresponding decompression technique to enable the original data to be reconstructed and accessible to applications. When an update is made to a compressed data, it is generally not efficient to decompress and recompress the entire block or file, particularly when the update is to a relatively small part of data.

For example, the compression system may be configured to intercept communication between the computer(s) and the storage device(s), and to derive and compress data blocks corresponding to the data access-related request. During "write" operation on the data blocks to be compressed before storage, the data blocks from the computer intercepted by the compression system, compressed and moved to a storage device. Data blocks containing different kinds of data (e.g. text, image, voice, etc.) may be compressed by different compression algorithms. A "read" operation may proceed in reverse direction; the required data blocks are retrieved by the compression system, decompressed (partly or entirely, in accordance with required data range) and sent to the appropriate API. The compression system may be configured to transfer selected control-related requests (e.g. format disk, de-fragment disk, take a snapshot, etc.) between the computer and the storage device in a transparent manner, while intervening in data access-related transactions (e.g. read, write, etc.) and some control related transactions (e.g. capacity status, etc.) Moreover, the compression system may also be configured to compress only selected passing blocks of data in accordance with pre-defined criteria (e.g. LUN number, size, IP address, type of data, etc.). The raw data (or their relevant part) may be compressed by the compression system during or before writing to the storage device. Similarly, the compressed data (or their relevant part) are decompressed by the compression system during or after reading from the storage device.

One of the objectives of compression data is to enable substantial identity between a decompressed compression section and the original data accommodated in said section as result of compression. The size of the compressed sections may be configurable; larger compressed sections provide lower processing overhead and higher compression ratio, while smaller compressed sections provide more efficient access but higher processing overhead. The size of the compressed section may be predefined also in accordance with a certain time-related criterion (e.g. estimated time necessary to compress data which, being compressed, would substantially amount to the compressed section size, etc.).

The mechanisms of the illustrated embodiments describe processing a previously compressed data stream by a processor device in a computer storage environment. The compressed data stream may include a variety of compression formats, such as a JPEG, thus the previously compressed data stream may include a JPEG data stream. In one embodiment, by way of example only, the previously compressed data stream is separated into an input data block, which includes a header input block having a previously compressed header. The previously compressed header may include a variety of compression formats, such as a JPEG, thus the header may be a JPEG header. A sequences of bits are included with the input data block. Compression schemes are derived from information from the previously compressed header, such as a JPEG header. The input data block may be accessed and recompressed following the header input block in a previously compressed data stream (e.g., a JPEG data stream) one at a time using a block-image synchronization information. Access to the block-image synchronization information may be initialized by the compression scheme information to generate an output data block. The block-image synchronization information may be used to provide decompression information to facilitate decompression of results of the output data block. The decompression information may be stored in the output block.

In one embodiment, the decompression information may be derived from the compression scheme information in combination with the block-image synchronization information, thus the decompression information may be comprised of the compression scheme information and the block-image synchronization information. The decompression information may be stored in a variety of arrangements. For example, the decompression information may be stored in a singular output block, and/or the decompression information of the actual output block itself may be stored in a single location, and the decompression information may be stored in each and every output block for decompressing on a block-by-block basis, and may be stored in at least one location accessible for independent decompression of several of the output blocks. The output block(s) may be randomly accessed and may be decompressed using the decompression information.

In one embodiment, the mechanisms of the illustrated embodiments configure the block-image synchronization information with an indication having instructions for synchronizing the one input data block to a known repeating structure of data in the input data block. The indication includes a notification signifying whether a first bit in the at least one input data block belongs to one of a y matrix, cb matrix, and cr matrix and a location of the first bit within the one of the y matrix, cb matrix, and cr matrix. The output block may be decompressed using sequence interpretation information. The block-image synchronization information may be stored in a predetermined location within a header, in a predetermined location in one of the input blocks, in a predetermined location in one of the output blocks, and/or a storage location accessible to one of the recompressing and decompressing process.

In one embodiment, a variety of recompression processes may be used such as prediction by partial mapping (PPM), Burrows Wheeler Transform (BWT), arithmetic coding, deflate, and/or optimized Huffman compression for the recompressing. The compression scheme information may be derived from a previously compressed header. In addition, a marker may be used to indicate a location from which the block-image synchronization information is stored in the previously compressed header. The block-image synchronization information may be stored for accessibility while encoding the previously compressed header. A start of scan marker may be identified to indicate a location from which an input block data section storing data of the at least one input block begins. Also, a header may be identified as the previously compressed header (e.g., the head may be identified as a JPEG header). Several markers may be identified if the header is the previously compressed header (e.g., a JPEG header). The previously compressed header may be compressed and may also be decoded the before identifying the markers. The compression and/or decoding may occur before the markers are identified. The input data block may be recompressed to generate several output data blocks.

In one embodiment, a reading operation is received pertaining to incoming previously compressed information (for example incoming JPEG compressed information) for decompressing the recompressed information using the decompression information. The previously compressed information may be restructured and outputted as recompressed. The compression scheme information may be configured and/or adapted to include at least one Huffman table.

In one embodiment, the present invention provides for higher lossless recompression for previously compressed data/files (such as JPEG data/files), which is compatible to real-time systems including handling of multi-block and random access of streamed input blocks. In one embodiment the present invention allows for re-encoding previously compressed information (such as JPEG information) stored in memory, such as flash memory, in which input blocks of data are randomly accessed rather than being accessed in an order determined by the data's natural sequence, and a method for decoding re-encoded previously compressed information (e.g., JPEG compressed information) stored in flash memory, or in any other type of memory in which output blocks of data are randomly accessed rather than being accessed in an order determined by the data's natural sequence. Moreover, the previously compressed data (e.g., JPEG data) is decompressed to quantized discrete cosine transform (DCT) coefficients separated to independent previously compressed stream data output blocks. The coefficients Huffman coding is then replaced by using predictive model compression.

In one embodiment the present invention improves lossless compression of previously compressed image data streamed as separate sequential input blocks by use of segmented entropy coding in reference to the 8×8 DCT transformed coefficients and by maintaining a joint resource state used for DCT extraction of independent output blocks.

In one embodiment the present invention provides for reducing previously compressed image file sizes including multi-threaded recompression of previously compressed data and improving collection and separation of coefficients and context within a previously compressed stream.

In one embodiment of the present invention, databases similar to Oracle or SQL, hard disks, anti-viruses, file systems and operating systems, which support previously compressed input and are operative to re-compress and de-compress input to their systems, are shown and described herein. File systems may for example de-compress in random access fashion because the output blocks being de-compressed are typically not stored in order, within the hard disk. Typically, each such system first determines whether a particular input is previously compressed, for example determining if the particular input is JPEG compressed, if so, the system re-compresses and de-compresses, as shown and described herein, as an integral part of their normal operations. The mechanisms of the illustrated embodiments apply to a variety of compression formats and the references to the JPEG compression format will often times be used as way of illustration and example to provide further clarification and understanding. For example, the illustrated embodiments and figures use the term "JPEG" as a way of illustration and example of data, files, images, headers, etc., that have previously been compressed. It should be recognized that the use of the term "JPEG" in the illustrated embodiments and figures are one embodiment in which the mechanisms may be implemented. However, a variety of other compression formats may be applied and implemented for any "previously compressed" data, file, image, header, etc., as mentioned throughout.

Turning to FIG. 1, an example computer system 10 is depicted which can implement various aspects of the present invention. Computer system 10 includes central processing unit (CPU) 12, which is connected to mass storage device(s) 14 and memory device 16. Mass storage devices can include hard disk drive (HDD) devices, which can be configured in a redundant array of independent disks (RAID). The backup operations further described can be executed on device(s) 14, located in system 10 or elsewhere. Memory device 16 can include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24.

Figure 2:
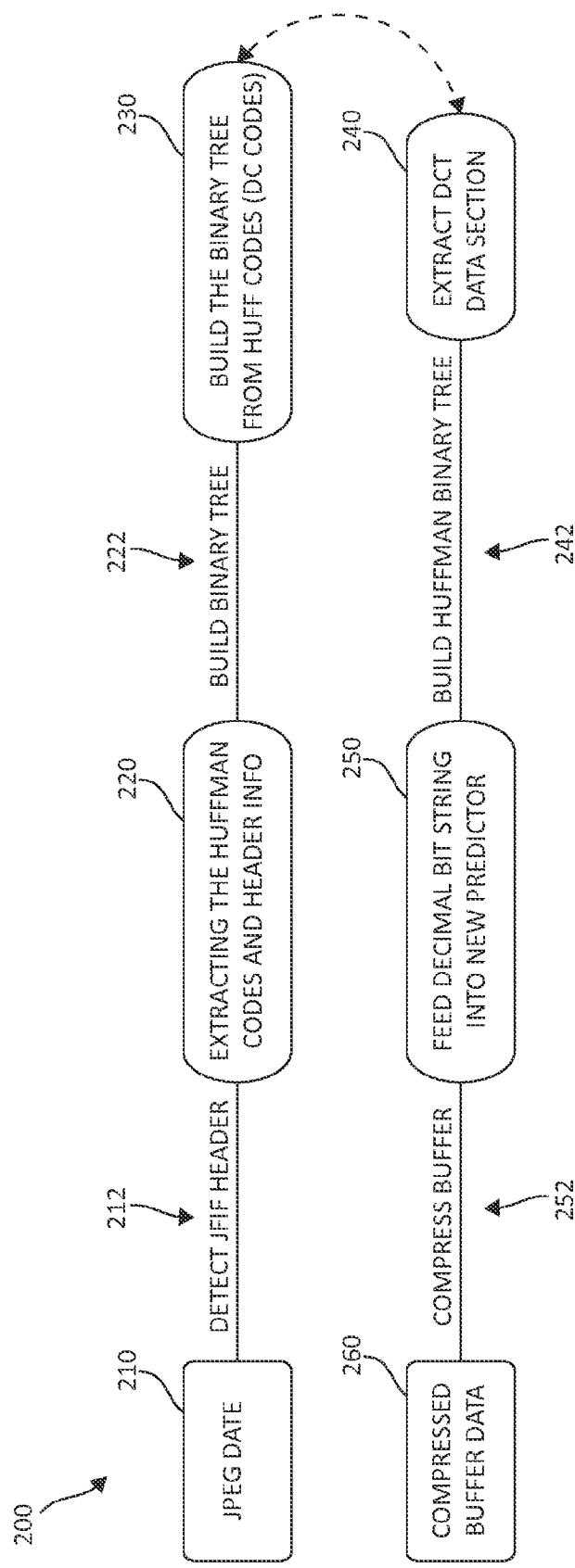
FIG. 2 illustrates an exemplary flowchart diagram of a method in which Discrete cosine transform (DCT) coefficients in each previously compressed data input block are expanded with the extracted DC codes being fed to a suitable conventional partial matching predictor.

FIG. 2 illustrates an exemplary flow chart diagram 200 of a method in which discrete cosine transform (DCT) coefficients in each previously compressed data input block (e.g., a JPEG data input block) are expanded with the extracted discrete cosine (DC) codes being fed to a suitable conventional partial matching predictor. As shown, a JFIF header (step 212) is detected in previously compressed (e.g., JPEG) data (step 210). Huffman codes and header information are extracted (step 220) and a binary tree (step 222) is built from the Huffman codes, e.g. discrete cosine (DC) codes (step 230). Subsequently, a DCT data section is extracted (diagram 240) and a Huffman binary tree is once again built (step 242). A decimal bit string is fed into a new predictor (step 250). A buffer is compressed (step 252). Reference numeral indicates the compressed buffer data (step 260).

Figure 3:
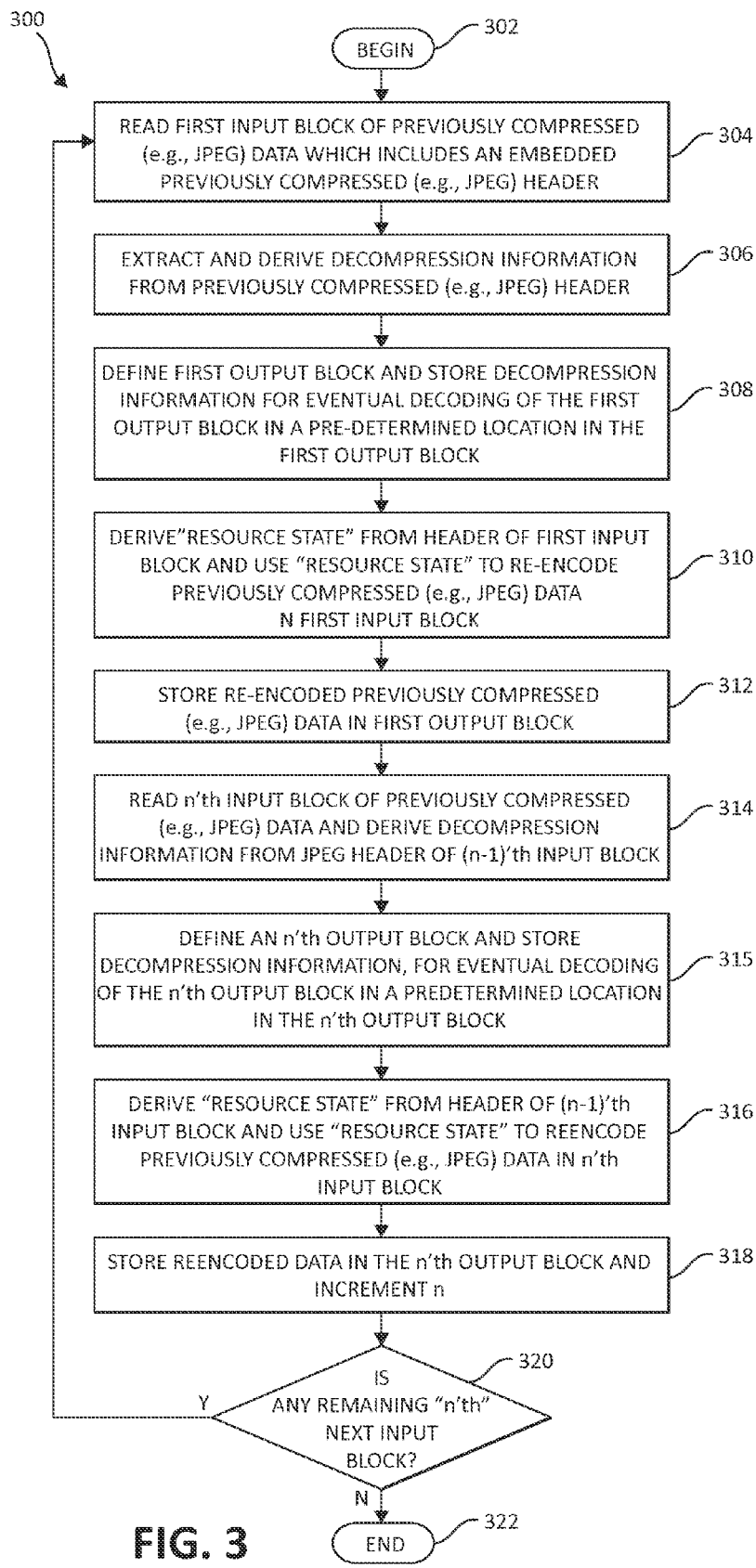
FIG. 3 is a flowchart illustrating an exemplary method of output block format handling for separating previously compressed data into separate input streams.
Figure 11:
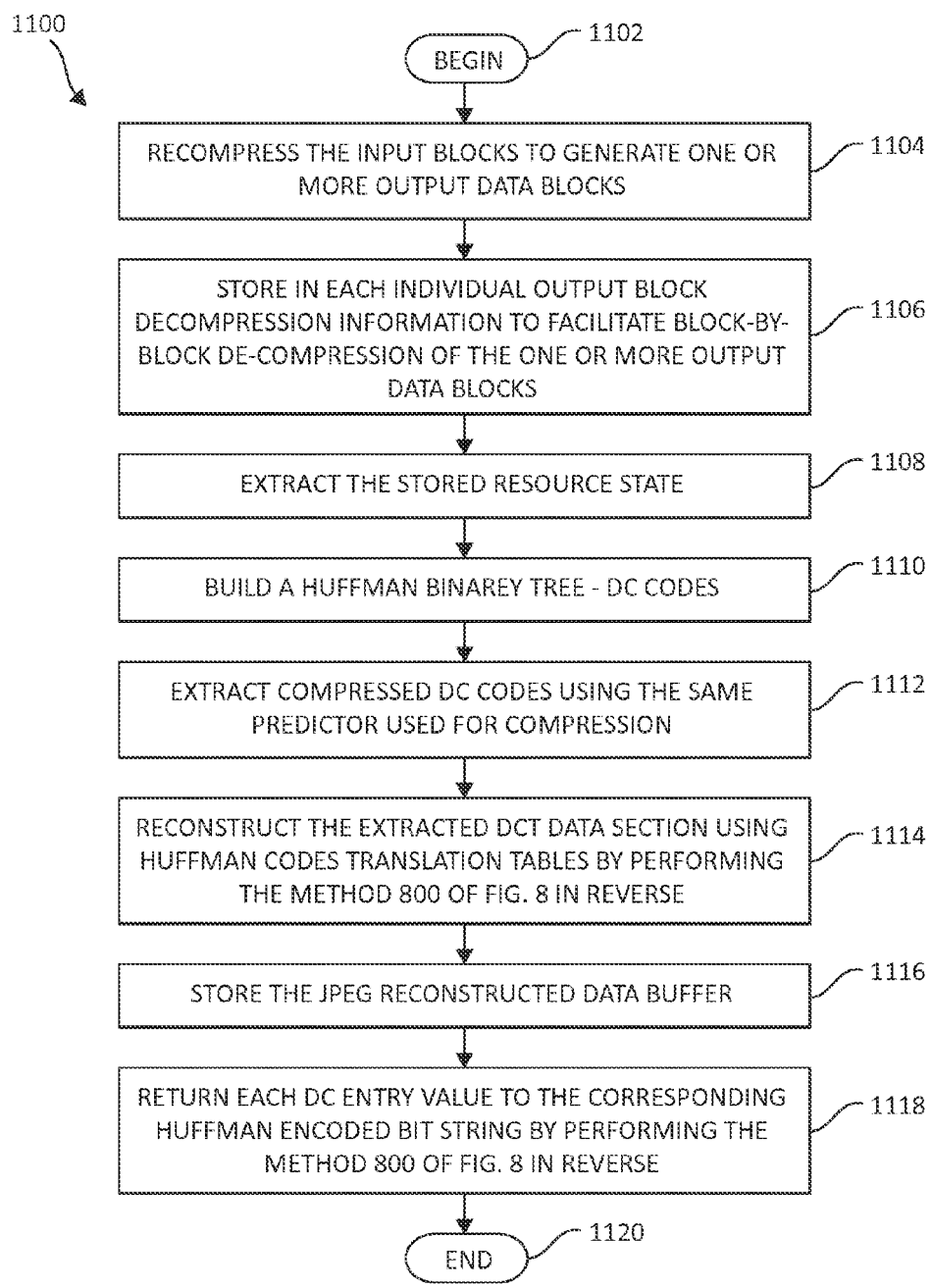
FIG. 11 is a flowchart illustrating an exemplary method for block-by-block de-coding of re-encoded previously compressed data.

FIG. 3 is a flowchart illustrating an exemplary method 300 of output block format handling for separating previously compressed data (e.g., JPEG data) into separate input streams. In one embodiment, by way of example only, the method for separating previously compressed data (e.g., JPEG data) into separate input streams of 32 KB, which is useful in performing the encoded buffer encoding/writing as per the method of FIG. 4 as well as the encoded buffer Reading method of FIG. 11, is illustrated.

The method begins (step 302) by reading a first input block of previously compressed data (e.g., JPEG data), which includes an embedded previously compressed Header (e.g., a JPEG Header) (step 304). Decompression information is extracted and derived from the previously compressed header (step 306). A first output block is defined and stores decompression information for eventual decoding of the first output block in a pre-determined location in the first output block (step 308). The method 300 derives "resource state" from the header of the first input block and use "resource state" to re-encode previously compressed data (e.g., JPEG data) in the first input block (step 310). Re-encoded previously compressed data (e.g., JPEG data) is stored in the first output block (step 312). The method 300 will read an n'th input block of previously compressed data (e.g., JPEG data) and derive decompression information from previously compressed header (e.g., JPEG header) of (n−1)'th input block (step 314). Next, the method 300 will define an n'th output block and store decompression information, for eventual decoding of the n'th output block in a predetermined location in the n'th output block (step 315). A "resource state" is derived from header of (n−1)'th input block and will use the "resource state" to re-encode previously compressed data (e.g., JPEG data) in n'th input block (step 316). The re-encoded data is stored in n'th output block and will increment n (step 318). The method 300 will then determine if there is any remaining "n'th" next input block (step 320). If "Yes" the method will repeat the entire method 300 until there are no remaining "n'th" next input block. If there are no remaining "n'th" next input blocks, the method ends (step 322).

In one embodiment, by way of example only, previously compressed data (e.g., JPEG data) is separated into separate input streams of 32 KB. Typically, a previously compressed data stream (e.g., JPEG data stream) is divided into chunks of suitable size, typically of 32K or 64K. To enable Real-time Multi-Block compression, DCT Huffman table translation codes, and block-image synchronization information across sequential sessions of compression, are stored. In order to accommodate for independent/random access decoding, the resource states are stored at either at the beginning of output block data or stored in at least one of the output data blocks as resource states used for output block decompression phase. The input block of previously compressed data includes an embedded previously compressed Header (e.g., JPEG header), which is extracted and stored in all subsequent encoded/output blocks. In the input block and in all subsequent input blocks, typically, the resource state from the previous input block is appended for subsequent de-coding and is used for re-encoding.

Figure 4:
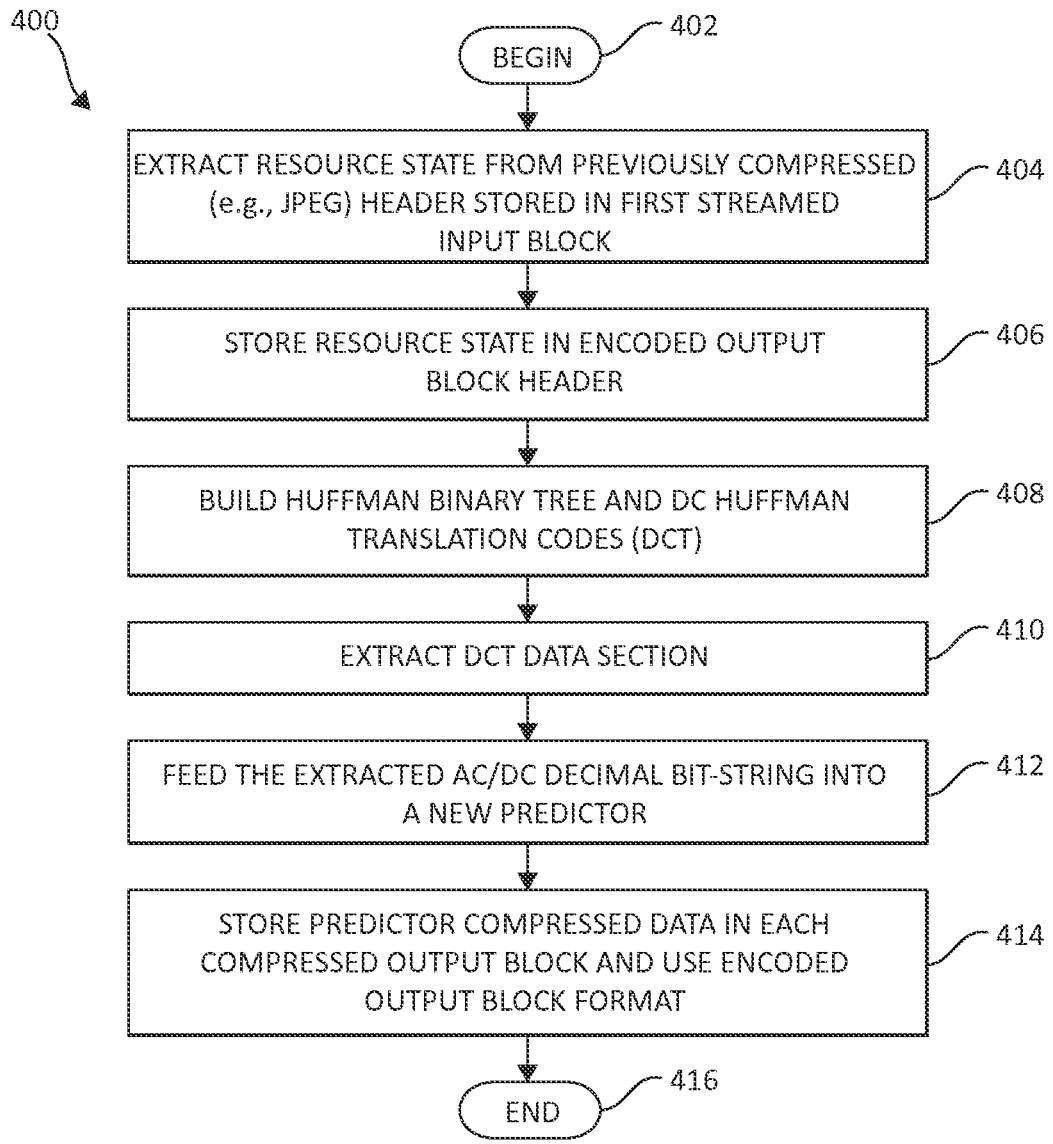
FIG. 4 is a flowchart illustrating an exemplary method for input block-by-block encoding of previously compressed data.
Figures 5, 6:
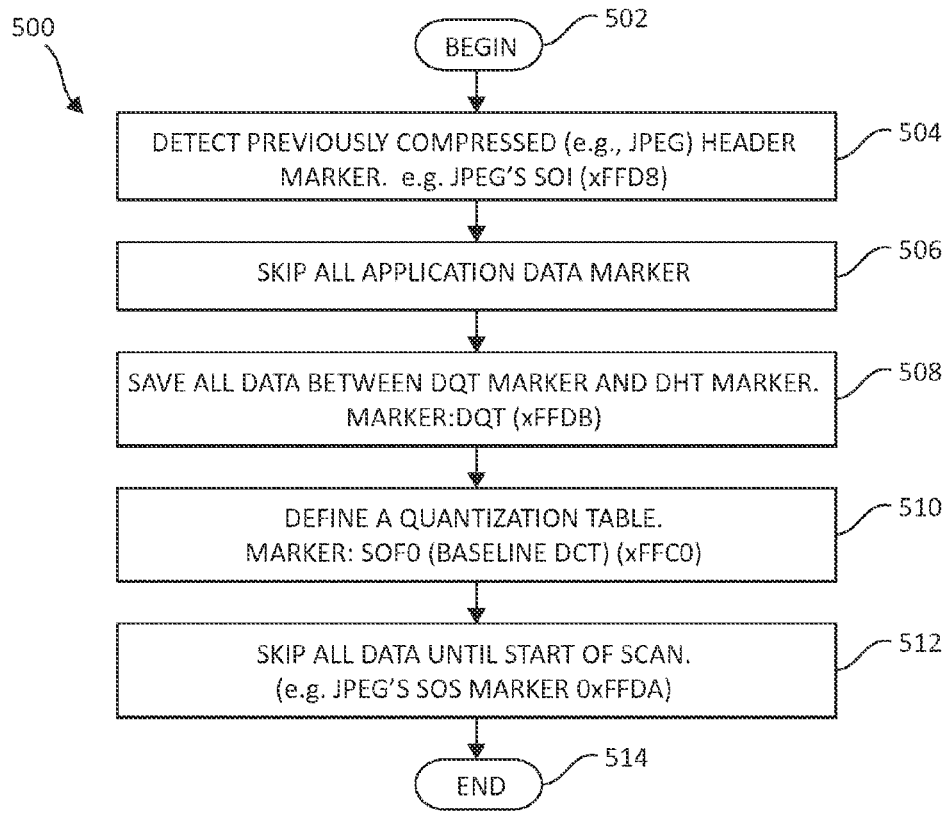
FIG. 5 is a flowchart illustrating an exemplary method for performing a resource state extraction step as mentioned in FIG. 4.
FIG. 6 is a simplified diagram of a suitable format for resource state information extracted by the method described in FIG. 5.

FIG. 4 is a flowchart illustrating an exemplary method 400 for input block-by-block encoding of previously compressed data (e.g., JPEG data). In one embodiment, by way of example only, the input block-by-block encoding of previously compressed data (e.g., JPEG data) may be stored in output blocks within a flash memory device. The method 400 begins (step 402) by extracting a resource state from previously compressed header stored in a first streamed input block (step 404). Typically, the input block(s) which contains the JFIF header which typically stores Huffman tables plus (+) compression scheme information is/are streamed, e.g. as per the flowchart of FIG. 5. The resource state is stored in an encoded output block header (step 406). The resource state used and stored in all preceding previously compressed data (e.g., JPEG data) output block(s) refer to the same full previously compressed stream (e.g., JPEG stream). The resource state may be used for all subsequent encoding sessions and the encoding header/resource state format may be used as illustrated in FIG. 6. A Huffman binary tree and DC Huffman Translation Code(s) (DHT) are built (step 408). The DHT entries in the previously compressed file may only list the Length and Code values but not the actual Bit String mapping.

Figure 7A:
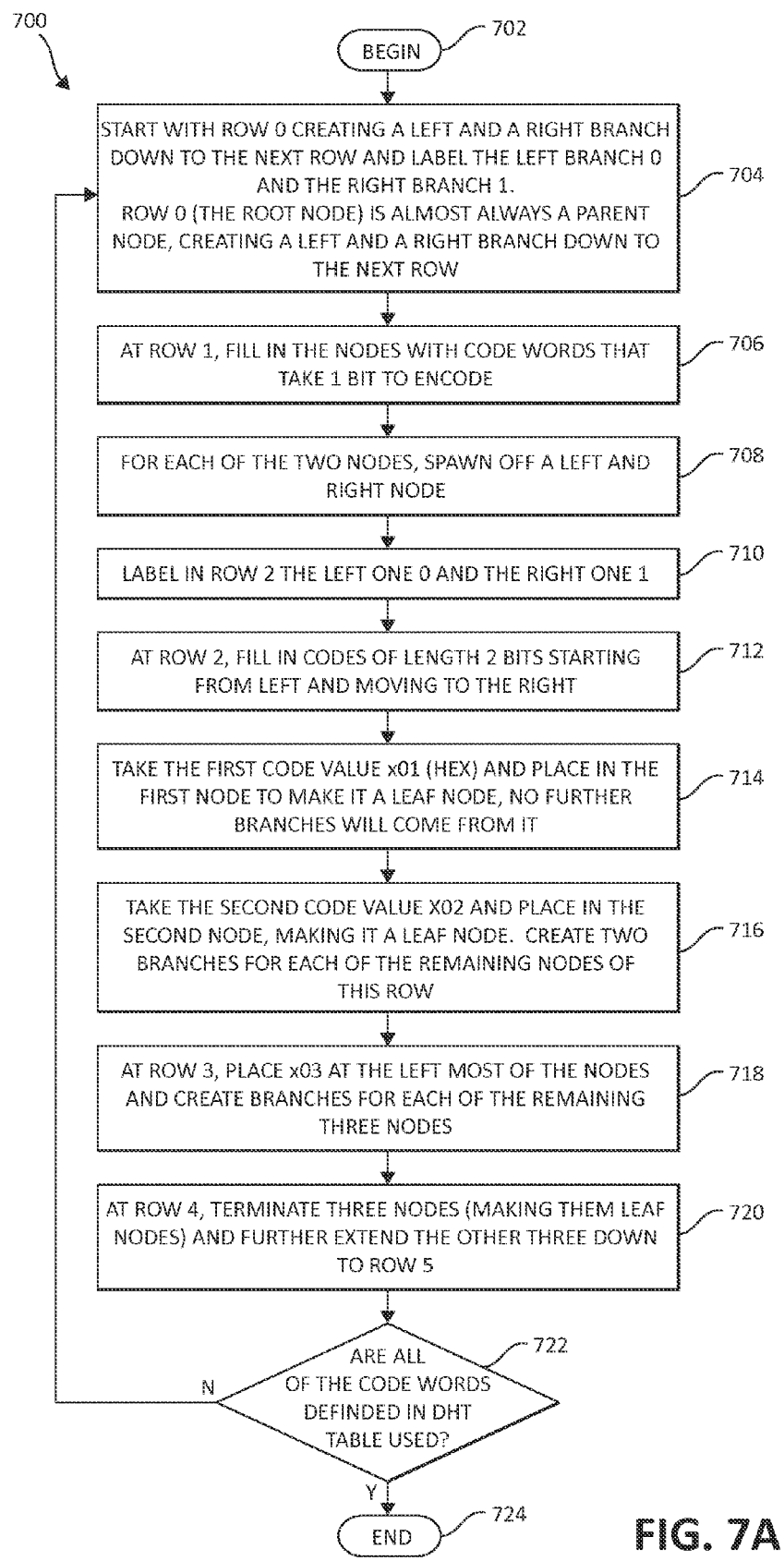
FIG. 7A is a flowchart illustrating an exemplary method for performing the Huffman binary tree building step as mentioned in FIG. 4.

Therefore, binary tree representation of the DHT table may be rebuilt to derive the bit strings, e.g. as shown in FIG. 7A. For example, a typical first Huffman table is shown and illustrated in FIG. 7B. The method 400 will then extract the DCT data section (step 410). The method 400 will feed the extracted AC/DC decimal bit-string into a new predictor (step 412). The predictor can be any of the well-known partial matching of an adaptive statistical data compression technique based on context modeling and prediction. The partial matching model uses a set of previous symbols in the uncompressed symbol stream to predict the next symbol in the stream. The predictor-compressed data is stored in each compressed output block and use an encoded output block format (step 414). The method 400 ends (step 416).

In one embodiment, by way of example only, deriving compression scheme information from the previously compressed header is described below. This operation may for example include: a) decoding the previously compressed header if it is encoded, b) identifying the header as a previously compressed header so that markers will be identified as below only if the header is a JPEG header e.g. as referenced in FIG. 5; and then, if the header is a previously compressed header, c) identifying a marker indicating the location from which block-image synchronization information is stored in the header and storing the block-image synchronization information for accessibility while encoding, and d) identifying a "start of scan" marker indicating a location from which a input block data section, storing input block data begins. A resource state is extracted from previously compressed header stored in a streamed input block. The resource state is stored in at least one of the output block header/or in an external resource which is accessible for both encoding/decoding processes: The resource state is used for all preceding previously compressed input data blocks which refer to the same full previously compressed stream. A Huffman binary tree is built including the DC Codes. The DHT entries in the previously compressed file may only list the Length and Code values, not the actual Bit String mapping. Therefore, the binary tree representation of the DHT table has to be rebuilt to derive the bit strings. A DCT data section is extracted. Typically, there are 3 components since currently most digital photos are full-color natural/organic images, represented by three image components (one luminance and two color channels) including a Y component, a Cb component and a Cr component. Alternatively, more than 3 components may be provided. For example, in some applications, more than one Y component is provided, such as 2 Y components.

The extracted AC/DC decimal bit-string is fed into a new predictor. The predictor may use any suitable conventional Partial Matching of an adaptive statistical data compression technique based on context modeling and prediction. The Partial Matching model uses a set of previous symbols in the uncompressed symbol stream to predict the next symbol in the stream. The predictor compressed data is stored after resource state in each compressed output block.

Encoding, according to certain embodiments of the present invention, includes the following operations: deriving compression scheme information from the previously compressed header e.g. as previously described. The operation may, for example, include decoding the previously compressed header if it is encoded, identifying the header as a previously compressed header so that markers will be identified only if the header is a previously compressed (e.g., JPEG) header, as illustrated in FIG. 5; and then, if the header is a previously compressed header (e.g., JPEG header), identifying a marker indicating the location from which block-image synchronization information is stored in the header and storing the block-image synchronization information for accessibility while encoding, as shown in FIG. 5; identifying a "start of scan" marker indicating a location from which a input block data section, storing input block data, begins, e.g. as per step 540 in FIG. 5.

Encoding, according to certain embodiments of the present invention, may also include the following operations: using the block-image synchronization information to provide decompression information which facilitates decompression of the result of the output data blocks and storing the decompression information, for retrieval preparatory to decompression, as described previously in the method of FIG. 4.

Encoding, according to certain embodiments of the present invention, may also include the following operations: accessing and recompressing the input blocks following the header input block in the previously compressed data stream one at a time using block-image synchronization information, as described in FIG. 4. Typically, access to the block-image synchronization information is initialized by the compression scheme information to generate one or more output data blocks.

FIG. 5 is a flowchart illustrating an exemplary method 500 for performing the resource state extraction step as mentioned in FIG. 4. The method 500 begins (step 502) with detecting a previously compressed (e.g., JPEG) header Marker (step 504). In one embodiment, by way of example only, the previously compressed (e.g., JPEG) header Marker being identified as previously compressed (e.g, JPEG's) SOI (xFFD8). The method 500 will skip all Application data Marker (step 506). In one embodiment, by way of example only, the Application data Marker being identified as previously compressed (e.g., JPEG's) APP0 (xFFE0-xFFEE). All data is saved between DQT Marker and DHT Marker (step 508). In one embodiment, by way of example only, the DQT being identified as DQT (xFFDB). A Quantization Table is defined (step 510). In one embodiment, by way of example only, the following markers being identified as Markers: SOF0 (Baseline DCT) (xFFC0), Marker: DHT (Define Huffman Table) (xFFC4). Next, the method 500 will skip all data until a start of scan (step 512). In one embodiment, by way of example only, previously compressed (e.g., JPEG's) SOS marker identified as 0xFFDA. The method 500 will then end (step 514).

FIG. 6 is a simplified diagram of a suitable format for resource state information extracted by the method 500 of FIG. 5. Each component of the format shown in FIG. 6 is now described. In one embodiment, by way of example only, the first row "a" includes an image identification (Image ID) identifying the previously compressed image (e.g, JPEG image) which is being re-compressed or whose re-compressed representation is being de-compressed. In one embodiment, row "b" indicates Block-Image synchronization information. In one embodiment, by way of example only, the Block-Image synchronization information is 0=Y, 1=Cb, 2=Cr, and a DC entry Number.

In one embodiment, by way of example only, row "c" represents a Quantization table marker (the Quantization table marker being previously compressed (e.g., JPEG's) FFDB). The first two bytes (the length) after the marker indicate the number of bytes, including the two length bytes, that this header contains until the length is exhausted (loads two quantization tables for baseline previously compressed file/data (e.g., JPEG file/data). In one embodiment, the precision and the quantization table index is one byte: precision is specified by the higher four bits and index is specified by the lower four bits. In one embodiment, the precision may be either 0 or 1 and indicates the precision of the quantized values; 8-bit (baseline) for 0 and up to 16-bit for 1. In one embodiment, the quantization values are 64 bytes. The quantization tables are stored in zigzag format. In one embodiment, by way of example only the quantization table information may be identified by recognizing its marker and simply skipped by the method of the present invention.

In one embodiment, row "d" is a Huffman table marker (e.g. previously compressed e.g., JPEG's FFC4): the first two bytes (the length) after the marker indicate the number of bytes, including the two length bytes, that this header contains until length is exhausted (usually four Huffman tables). In one embodiment, the index is one byte: if (greater than)>15 (i.e. 0x10 or more) then the index is an AC table, otherwise the index may be a DC table. In one embodiment, Bits are 16 bytes. In one embodiment, the Huffman values are the number (#) of bytes equal (=) the sum of the previous 16 bytes.

In one embodiment, row "e" represents a frame marker (the frame marker being JPEG's FFC0): the first two bytes, the length, after the marker indicates the number of bytes, including the two length bytes that the header contains. In one embodiment, P is one byte: the sample precision in bits (usually 8, for baseline previously compressed file/data (e.g., JPEG file/data). In one embodiment, Y is two bytes. In one embodiment, X is two bytes. In one embodiment, Nf is one byte: the number of components in the image. In one embodiment, 3 is for color baseline previously compressed images (e.g., JPEG images) and 1 is for grayscale baseline previously compressed images. In one embodiment, the following appear Nf times: Component ID is one byte; H and V sampling factors are one byte: H is the first four bits and V is the second four bits; Quantization table number is also one byte.

In one embodiment, row "f" illustrates a Start of Scan marker (the Start of Scan marker being JPEG's FFDA): the first two bytes (the length) after the marker indicate the number of bytes, including the two length bytes, that this header contains and the number of components, n is one byte: the number of components in this scan and n times may be the Component ID of one byte. The DC and AC table numbers may be one byte: DC number (#) is the first four bits and the AC number (#) is last four bits. In one embodiment, Ss is one byte. In one embodiment, Se is one byte. In one embodiment, Ah and Al are both one byte.

FIG. 7A is a flowchart illustrating an exemplary method 700 for performing the Huffman binary tree building step of FIG. 4. The method 700 begins (step 702) by starting with row 0 and creating a left and a right branch down to the next row and label the left branch 0 and the right branch 1 (step 704). Row 0 (the root node) is typically a parent node, creating a left and a right branch down to the next row. At row 1, fill in the nodes with code words that take 1 bit to encode (step 706). As is apparent from the DHT there are no codes of length 1 bit. Thus, for each of the two nodes, spawn off a left and right node (step 708). This creates a total of four (4) nodes. Label 0 for the left branch and 1 for the right branch.

In row 2, fill in any codes of length 2 bits, starting from left to right and label the left branch 0 and the right branch 1 (step 710). There will be two codes from DHT that can be encoded with bit strings of length 2. Therefore, at row 2, fill in the codes of length 2 bits starting from left and moving to the right (step 712). Take the first code value x01 (hex) and place in the first node to make it a leaf node; no further branches will come from the leaf node (step 714). Take the second code value x02 and place in the second node, making it a leaf node. At this point there will be two more nodes left in row 2 of the tree but no more code words listed in the DHT for this bit-string length. The method 700 will then create two branches for each of the remaining nodes of row 2 (step 716). Since two nodes are left, as previously discussed, the creation of the two additional branches will create a total of 4 branches, meaning that there are again 4 nodes in the third row of the binary tree.

At row 3, four nodes will be available but the DHT indicates only one code word that uses 3 bits to encode. Thus, the method 700 will place "x03" at the leftmost of the nodes and create branches for each of the remaining three nodes (step 718). At row 4, six nodes will be available, but the DHT indicates only three code words using 4 bits to encode. The method 700 will terminate three nodes (making them leaf nodes) and further extend the other three down to row 5 (step 720). The method 700 will then check to see if all of the code words defined in the DHT table are used (step 722). If no, the process continues until all of the code words defined in the DHT table have been used. The process repeats each of the steps, as previously discussed, starting with row 0 creating a left and a right branch down to the next row and label the left branch 0 and the right branch 1 (step 704). If all of the code words defined in the DHT table are used, the method 700 will end (step 724).

The expansion of the first four rows of the above DHT is shown herein. For example, a typical first Huffman table is as shown in FIG. 7B. For example, a typical first Huffman table that is built from FIG. 7A. FIG. 7B illustrates a Huffman table for Luminance (Y)-AC. In The first column indicates the length of the bit starting a 2 bits and going to 16 bits. The second column indicates the Bits. The third column represents the code for the associated length and bits. For example, the length of 2 bits in the Length column respectively shows 00 and 01 in the bits column, and the associated code for 00 is 01 and the code for 01 is 02. Moreover, by way of example only, the length of 16 bits in the first column illustrates the actual number of bits in the bits column of 1111 1111 1111 1111 1110 and a code value of FA. In addition, an end of block may occur and the table illustrates the end of block for the length of 4 bits, bit 1100 and the code of 00 (End of Block).

FIG. 8 is a flowchart illustrating an exemplary method 800 for performing the DCT data section extraction step of FIG. 4. The method begins (802) translating Y luminance CD Huffman Code to decimal representation (step 804). The method 800 will translate Y luminance AC Huffman code to decimal representation, until End of Block (EOB) is reached or until 63 AC values have been extracted (step 806). Next, the method 800 will translate Cb/Cr chrominance DC Huffman codes to decimal representation (step 808). The Cb/Cr chrominance AC Huffman code is translated to decimal representation, until EOB is reached or until 63 AC values have been extracted (step 810). The method 800 will determine if the entire minimum coded unit (MCU) blocks have been processed (step 812). If no, the method will repeat the process starting with translating Y luminance CD Huffman Code to decimal representation (step 804) and continue as previously discussed. If all of the minimum coded unit (MCU) blocks have been processed, the method will end (step 814). A separate Huffman table may be provided for each of the four components: luminance DC component (Y luminance CD), luminance AC components (Y luminance AC), chrominance DC component (Cb/Cr chrominance DC) and chrominance AC components (Cb/Cr chrominance AC).

FIG. 9 is a block diagram illustrating an exemplary Huffman table. In one embodiment, the first row shows the section starting at 1 and going to 6. The second row shows the component Y, Cb, and Cr. The third row shows the AC and the DC. In Section 1 and 2 the component is Y, and is DC for section 1 and is AC for section 2. In section 3 and 4 the component is Cb, and is DC for section 3 and is AC for section 4. In section 5 and 6 the component is Cr, and is DC for section 5 is and is AC for section 6. In one embodiment, by way of example only, FIG. 9 presents both a standard JPEG file encoding scheme and an expected coding scheme for 3-component scan data, for each Minimum Coded Unit (MCU), with no chroma subsampling.

Figure 10:
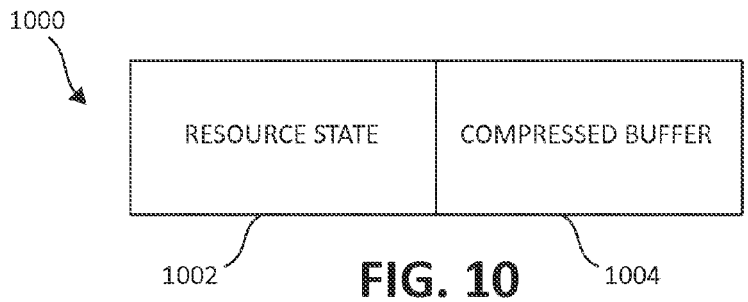
FIG. 10 is a diagram of a suitable format for storing predictor compressed data.

FIG. 10 is a block diagram 1000 illustrating an exemplary format for storing predictor-compressed data. The resource state 1002 is useful for previously compressed recompression (e.g., JPEG recompression) including Compression scheme information and Block-image synchronization information. This information may reside in, and be accessed from, an external memory device during encoding and during decoding, and may reside in and be accessed from each output block to be decoded. The compressed buffer 1004 is shown where the compressed buffer data 260 (FIG. 2) may be compressed.

FIG. 11 is a flowchart illustrating an exemplary method 1100 for block-by-block de-coding of re-encoded previously compressed data (e.g., JPEG data). In one embodiment, the block-by-block decoding of re-encoded previously compressed data may be stored in output blocks within a flash memory device, the method 1100 including use of decompression information which includes, or from which may be derived, compression scheme information and block-image synchronization information, in order to decode. The method 1100 of FIG. 11 typically enables recompression of a previously compressed data stream (e.g., JPEG data stream) which is separated into one or more input data blocks including a header input block having a previously compressed header (e.g., JPEG header), each input data block(s) including sequences of bits.

The method 1100 beings (step 1102) re-compressing the input blocks, thereby to generate one or more output data blocks. (1104). The method 1100 will store in each individual output block, decompression information to facilitate block-by-block decompression of the one or more output data blocks (1106). Next, the method 1100 will extract the stored resource state (step 1108) (as shown in FIG. 6). The method 1100 will build a Huffman binary tree with the DC Codes (step 1110). Compressed DC codes are extracted using the same predictor used for compression (step 1112). Extracted DCT data section is reconstructed using Huffman codes translation tables (step 1114) and is accomplished by performing the method 800 of FIG. 8 in reverse. The method 1100 will store previously compressed file/data (e.g., JPEG file data) reconstructed data buffer (step 1116). Each DC Entry Value is returned to the corresponding Huffman encoded bit string by performing the method of FIG. 8 in reverse (step 1118). The method ends (1120).

FIG. 12 is a block diagram illustrating an exemplary diagram of a DCT matrix from a single MCU (8×8 pixel square) in a digital photo. In one embodiment, the matrix entries shown are after quantization, which has caused many of the higher-frequency components (towards the bottom-right corner of the matrix) to become zero. By the distribution of values in the frequency-domain matrix representation, it is possible to determine that the 8×8 pixel square had very little high-frequency content (i.e. it had only a gradual intensity/color change).

FIG. 13A-D are tables illustrating an exemplary Huffman code translation tables. FIG. 13A 1300 is a Huffman code translation Table storing example Huffman—Luminance (Y)—DC values. FIG. 13B 1350 is a Huffman code translation Table storing example Huffman—Luminance (Y)—AC values. FIG. 13C 1375 is a Huffman code translation Table storing example Huffman—Chrominance (Cb & Cr)—DC values. FIG. 13D 1385 is a Huffman code translation Table storing example Huffman—Chrominance (Cb & Cr)—AC values. Each of the respective tables includes a column for the Length, Bits, and Code. Each row shows the length of the bits, the bits (binary number), and the code associated with the bits. An "End of Block" is illustrated, which may be interpreted to mean the end of a block with a known acronym to the standard format of a JPEG.

FIG. 14 is a table illustrating an exemplary bit field-decimal equivalent table 1400. In one embodiment, the table shows how the bit fields that follow a DC entry can be converted into their signed decimal equivalent. To use this table, start with the DC code value and then extract "Size" number of bits after the code. The "Additional Bits" will represent a signed "DC Value" which becomes the DC value for that input block. It is noted that this table applies to any previously compressed file/data (e.g., JPEG file/data). For example, it may be assumed that one was about to decompress a chrominance DC entry. If the previously decoded "DC Code" was 05, then extract 5 bits following the code bits. If the next 5 bits were 00101, then this can be interpreted as decimal −26. The bits 10001 would be +17 and 11110 would be +30.

FIGS. 15A 1500, 15B 1525, 15C 1550, and 15D 1575 are tables showing progression through an example encoding/writing work session using the method of FIG. 4. Each table shows the bits, the MCU, the component, the AC/DC, and the value.

Figure 16:
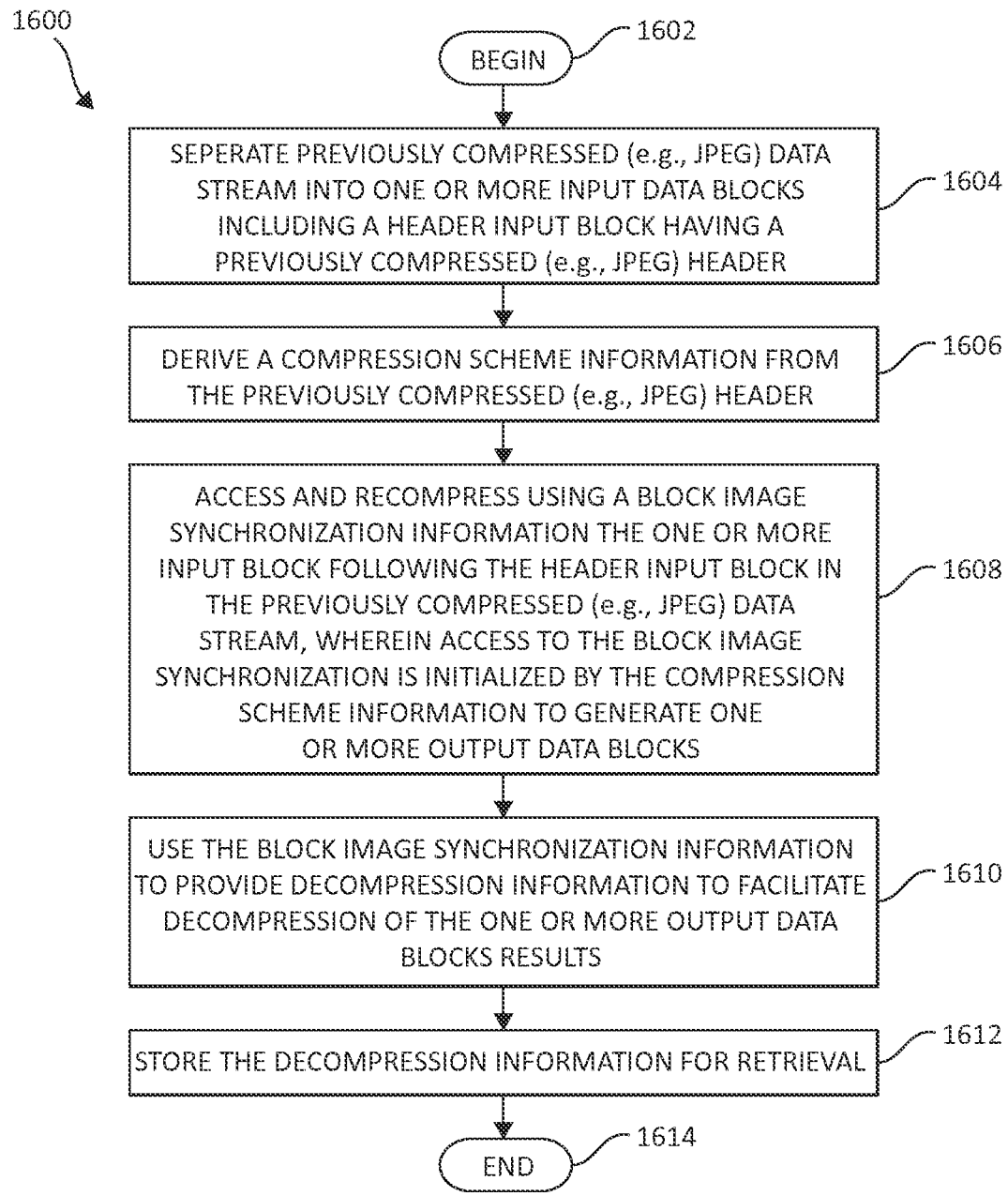
FIG. 16 is a flowchart illustrating the exemplary method of real-time multi-block lossless previously compressed data/file recompression.

FIG. 16 is a flowchart illustrating the exemplary method 1600 of real-time multi-block lossless previously compressed recompression (e.g., JPEG recompression). The method 1600 begins (step 1602) with separating previously compressed data streams (e.g., JPEG recompression) into at least one input data block including a header input block having a previously compressed header (e.g., JPEG header), wherein the at least one input data block includes a sequences of bits (step 1604). The at least one input data block may be one input data block or may be multiple input data blocks. Compression scheme information is derived from the previously compressed header (e.g., JPEG header) (step 1606). The input blocks are accessed and recompressed following the header input block in the previously compressed data stream (e.g, JPEG data stream) one at a time using block-image synchronization information, where access to the block-image synchronization information is initialized by the compression scheme information, thereby to generate at least one output data block (step 1608). The at least one output data block may be one output data block or may be multiple output data blocks. The block-image synchronization information is used to provide decompression information, which facilitates decompression of the result of the at least one output data block (step 1610). The decompression information is stored for retrieval (step 1612). The method 1600 ends (step 1614).

In one embodiment, the computer environment is configured for separating a previously compressed (e.g., JPEG) data stream into an input data block including a header input block having a previously compressed header (e.g, JPEG header). Sequences of bits are included with the input data block. Compression scheme information is derived from the previously compressed header. The input data block is accessed and recompressed following the header input block in the previously compressed data stream one at a time using block-image synchronization information. This process may occur by an input block re-compressor, which may be in the adapted, configured, or be in the form of a processor device. Access to the block-image synchronization information is initialized by the compression scheme information to generate an output data block. The block-image synchronization information is used to provide decompression information to facilitate decompression of the results of the output data block. The decompression information is stored in at least one output block. The decompression information is derived from the compression scheme information itself and the block-image synchronization information itself. The decompression information of the one output block may be stored in a single location. At least one output block is randomly accessed and decompressing at least one output block using the decompression information.

The decompression information may also be stored in only one of the one output block, in each of the one output block for decompressing block-by-block, at the beginning of at least one of the one output block, or in at least one location accessible for independent decompression of the plurality of output data blocks. The block-image synchronization information is configured with an indication with instructions for how to synchronize the one input data block to a known repeating structure of data in one of the input data block. The indication includes a notification signifying whether a first bit in the at least one input data block belong to one of a y matrix, cb matrix, and cr matrix and a location of the first bit within a matrix. In one embodiment, by way of example only, at least one output block is decompressed using a sequence interpretation information. The block-image synchronization information may be stored in a predetermined location within a header, a predetermined location in at least one of the one input blocks, a predetermined location in at least one of the output blocks, and/or a storage location accessible to at least one of the recompressing and decompressing processes. A decompression coordinator may be used for using the block-image synchronization information to provide decompression information, which facilitates decompression of the result of the output data blocks, and storing the decompression information for retrieval preparatory to decompression.

In one embodiment, by way of example only, several recompression process may be utilized; these recompression processes may include the prediction by partial mapping (PPM), Burrows Wheeler Transform (BWT), arithmetic coding, deflate, and optimized Huffman compression for the recompressing. A compression scheme information may be derived from the previously compressed header (e.g., JPEG header) from a header reader. A marker may be identified to indicate a location from which the block-image synchronization information is stored in the previously compressed header (e.g., JPEG header). The block-image synchronization information may also be stored for accessibility while encoding the previously compressed header (e.g., JPEG header). A start of scan marker may also be indicated to signify or provide notification for a location from which an input block data section storing data of the one input block begins. A header may be identified as the previously compressed header (e.g., JPEG header). If the header is the previously compressed header multiple markers may be identified. The previously compressed header is encoded. The previously compressed header may be decoded before identifying the markers.

In one embodiment, by way of example only, at least one input data block may be recompressed to generate output data blocks and storing in each of the output data blocks a decompression information to facilitate block-by-block decompression of the output data blocks. 16. The decompression information may also be stored in at least one location accessible for independent decompression of the output data blocks. A reading operation pertaining is received for an incoming previously compressed information (e.g., JPEG compressed information) for decompressing recompressed information using the decompression information. The incoming previously compressed information is reconstructed and then outputting the incoming previously compressed information as recompressed. The compression scheme information may include at least one Huffman table.

In one embodiment, by way of example only, a hard disk storage device or operating system is operative to distinguish between incoming previously compressed information and other incoming information to be stored. The hard disk storage device or operating system is operative to recompress the incoming previously compressed information and to store the recompressed information using the header reader, a input block re-compressor and a decompression coordinator. In one embodiment, by way of example only, the present invention manages storage of matrices of data on the hardware storage device and for generating of responses to queries regarding the data. The present invention is able to distinguish between incoming previously compressed information to be stored and other incoming information to be stored, and wherein, for incoming previously compressed information, the managing uses the header reader, the input block re-compressor and the decompression coordinator. An anti-virus system may be provided for scanning data for computer viruses and a scan is performed on reconstructed data generated by the block-by-block decompression of the second plurality of output data blocks. The anti-virus system includes a data healer operative to heal data found to include a computer virus to generate healed data. The data healer utilizes the header reader, the input block re-compressor and the decompression coordinator to recompress the healed data.

In one embodiment, as an example of an encoding/writing work session using the method of FIG. 4 is now described, in stages. In one embodiment, the de-coding/reading using the method of FIG. 11 may be symmetrical. In one embodiment, the example commences with stage A to extract Scan Data DC Values as per step 410 of FIG. 4. The scan data is: FC FF E2 AF EF F3 15 7F. In this example, that image content is 3 components (Y, Cb, Cr). Within each component, the sequence is always one DC value followed by 63 AC values. For each minimum coded unit (MCU), with no Chroma sub-sampling, the data is encoded as per FIG. 9. As previously mentioned, FIG. 12 is a diagram of a DCT matrix from a single MCU (8×8 pixel square) in a digital photo. The matrix entries shown are after quantization, which has caused many of the higher-frequency components (towards the bottom-right corner of the matrix) to become zero. By the distribution of values in the frequency-domain matrix representation, it is possible to determine that the 8×8 pixel square had very little high-frequency content (i.e. the 8×8 pixel square had only a gradual intensity/color change). The DC component represents the average value of all pixels in the 8×8 MCU. An image where all pixels in the 8×8 input block are the same has been intentionally created. The hex string presented above (FC FF E2 AF EF F3 15 7F) can be represented in binary as the following: 1111 1100 1111 1111 1110 0010 1010 1111 1110 1111 1111 0011 0001 0101 0111 1111.

In one embodiment, the example then moves to stage B and will extract Huffman Code Tables as illustrated in step 404 of FIG. 4 by extracting a Resource State from previously compressed (e.g., JPEG) header stored in first streamed input block. Next, the Huffman tables are extracted from the previously compressed (e.g., JPEG) image file as specified in FIG. 4. In one embodiment, the DHT Class=0 ID=0 and is used for DC component of Luminance (Y). In one embodiment, the DHT Class=1 ID=0 and is used for AC component of Luminance (Y). In one embodiment, the DHT Class=0 ID=1 and is used for DC component of Chrominance (Cb & Cr). In one embodiment, the DHT Class=1 ID=1 and is used for AC component of Chrominance (Cb & Cr). The extracted Huffman tables for the present example are illustrated in FIGS. 13A-13D. Specifically, the Huffman code translation tables of FIGS. 13A-13D include FIG. 13A 1300, a Table of Huffman—Luminance (Y)—DC values; FIG. 13B 1350, a Table of Huffman—Luminance (Y)—AC values; FIG. 13C 1375, a Table of Huffman—Chrominance (Cb & Cr)—DC values; and FIG. 13D 1385, a Table of Huffman—Chrominance (Cb & Cr)—AC values.

In one embodiment, the example continues to stage C store resource state e.g. as per step 406 of FIG. 4. The resource state is stored in at least one of the output block header/or in an external resource, typically including storing of the Huffman tables+Image ID+Current block-image synchronization information. In one embodiment, by way of example only the first input block indicates: Image ID=1; 0 (representing component Y); 0 (representing the first DC entry). In one embodiment, the example will continue to stage D. Stage D will build a Huffman binary tree; the Huffman DC Value decoding as per step 408 of FIG. 4. The DHT entries in the previously compressed file (e.g., JPEG file) may only list the length and code values, not the actual bit string mapping. Therefore, the binary tree representation of the DHT table may be rebuilt to derive the bit strings, e.g. as per FIG. 7A. For example, a typical first Huffman table is shown in FIG. 7B.

As previously discussed, the table of FIG. 14 is a bit field-decimal equivalent conversion table showing how the bit fields that follow a DC entry can be converted into their signed decimal equivalent. To use this table, start with the DC code value and then extract "Size" number of bits after the code. These "Additional Bits" will represent a signed "DC Value" which becomes the DC value for that input block. Note that this table applies to any previously compressed file/data (e.g., JPEG file/data). For example, we may assume that one was about to decompress a chrominance DC entry. If the previously decoded "DC Code" was 05, then extract 5 bits following the code bits. If the next 5 bits were 00101, then this can be interpreted as decimal −26. The bits 10001 would be +17 and 11110 would be +30.

In one embodiment, the example will continue to Stage E and extract DC Y Luminance (Extract DCT data section) as per step 410 of FIG. 4. Regarding Luminance (Y)—AC and referring to the Y (DC) table of FIG. 13A 1300, start with the first few bits of the coded stream (1111 1100 1111 . . . ) and recognize that code x0A matches the bit string 1111 110.

The binary number sequence 1111 1100 1111 1111 1110 0010 1010 1111 1110 1111 1111 0011 0001 0101 0111 1111 is associated with (=>) Code: 0A. This code implies that hex A (10) additional bits follow to represent the signed value of the DC component. The next ten bits after this code are 0 1111 1111 1. The table of FIG. 14, also termed herein a "DC table", shows the DC values represented by these "additional bits" and in this case, the bit string corresponds to a value of −512.

The binary number sequence 1111 1100 1111 1111 1110 0010 1010 1111 1110 1111 1111 0011 0001 0101 0111 1111 is associated with (=>) Value: −512 and thus the progress thus far is depicted in the table 1500 of FIG. 15A. After the DC component, the 63-entry AC matrix begins for the Y Luminance (Luminance (Y)—AC). This uses a different Huffman table 1350 of FIG. 13B. The binary number sequence 1111 1100 1111 1111 1110 0010 1010 1111 1110 1111 1111 0011 0001 0101 0111 1111 is associated with (=>) Code: 00 (EOB). In the Huffman code table 1350 of FIG. 13B, the code 1100 corresponds to an EOB (End of Block). Therefore, the AC component was cut short early (no other codes). This means that all 63 entries of the matrix (all entries except the 1st entry, which is the DC component) are zeros. Since the luminance component has been finished, the present invention will then move on to the chrominance components (Cb and Cr) as shown in table 1525 of FIG. 15B. The Cb/Cr Chrominance are extracted as shown as Chrominance (Cb)—DC: 1111 1100 1111 1111 1110 0010 1010 1111 1110 1111 1111 0011 0001 0101 0111 1111 is associated with =>Code: 00 (EOB). At the end of chrominance DC, the example will then start on AC: Chrominance (Cb)—AC 1111 1100 1111 1111 1110 0010 1010 1111 1110 1111 1111 0011 0001 0101 0111 1111 is associated with =>Code: 00 (EOB). Again, the AC is terminated right away. Next, the present invention will continue on to the second chrominance channel, Cr as shown in table 1550 FIG. 15C. Chrominance (Cr)—DC and refer to the table of FIG. 13C for the relevant Huffman codes. The binary number sequence 1111 1100 1111 1111 1110 0010 1010 1111 1110 1111 1111 0011 0001 0101 0111 1111 is associated with (=>) Code: 00 (EOB). This marks the end of the DC. At the end of the Chrominance (Cr)-DC, the example will then move on to AC: Chrominance (Cr)—AC and will refer to the table of FIG. 13D for the relevant Huffman codes 1111 1100 1111 1111 1110 0010 1010 1111 1110 1111 1111 0011 0001 0101 0111 1111 is associated with =>Code: 00 (EOB). This marks the end of the AC, as shown in table 1575 FIG. 15D.

In one embodiment, the example will continue to stage F. At this point, the new extracted DC Value is fed into the new predictor as shown in step 412 of FIG. 4. The extracted AC/DC decimal bit-string is fed into new the predictor—for example, stream each extracted value to prediction by partial matching (PPM) compressor-using order 1. In one embodiment, the example will continue to stage G. Store predictor compressed data in each compressed output block and use Encoded output Block Format 414 of FIG. 4. Store the PPM Compressor output buffer.

It is appreciated that terminology such as "mandatory", "required", "need" and "must" refer to implementation choices made within the context of a particular implementation or application described here within for clarity and are not intended to be limiting since in an alternative implantation, the same elements might be defined as not mandatory and not required or might even be eliminated altogether.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

The invention of claimed is:

1. A method for recompressing previously compressed data, comprising:
   receiving, by a processor, a set of data;
   determining if the set of data is JPEG data, the JPEG data comprising :
      a plurality of JPEG data blocks,
      a JPEG header block, and
      compression scheme information and block-image synchronization information stored in the JPEG header block and in each JPEG data block;
   recompressing the JPEG data utilizing the compression scheme information and the block-image synchronization information if the set of data is JPEG data; and
   storing the recompressed JPEG data.

2. The method of claim 1, further comprising storing the set of data if the set of data is not JPEG data.

3. The method of claim 1, wherein the set of data comprises a header reader and wherein storing the recompressed set of data comprises storing the recompressed set of data utilizing the header reader.

4. The method of claim 1, wherein each subsequent JPEG data block in the set of data comprises the compression scheme information and the block-image synchronization information from a previous JPEG data block.

5. The method of claim 1, wherein the set of data comprises a re-compressor and wherein storing the recompressed set of data comprises storing the recompressed set of data utilizing the re-compressor.

6. The method of claim 1, wherein the set of data comprises a decompression coordinator and wherein storing the recompressed set of data comprises storing the recompressed set of data utilizing the decompression coordinator.

7. The method of claim 1, wherein the set of data comprises two of a header reader, a re-compressor, and a decompression coordinator and wherein storing the recompressed set of data comprises storing the recompressed set of data utilizing the two of the header reader, the re-compressor, and the decompression coordinator.

8. The method of claim 1, wherein the set of data comprises a header reader, a re-compressor, and a decompression coordinator and wherein storing the recompressed set of data comprises storing the recompressed set of data utilizing each of the header reader, the re-compressor, and the decompression coordinator.

9. A system for recompressing previously compressed data, comprising:
   a processor; and
   memory coupled to the processor, the memory configured to store computer-readable code that, when executed by the processor, causes the processor to:
      receive a set of data, determine if the set of data is JPEG data, the JPEG data comprising:
a plurality of JPEG data blocks,
a JPEG header block, and
compression scheme information and block-image synchronization information stored in the JPEG header block and in each JPEG data block,
recompress the JPEG data utilizing the compression scheme information and the block-image synchronization information if the set of data is JPEG data; and
store the recompressed set of JPEG data in the memory.

10. The system of claim 9, wherein the memory further comprises code that, when executed by the processor, causes the processor to store the set of data in the memory if the set of data is not JPEG data.

11. The system of claim 9, wherein the set of data comprises a header reader and wherein, when storing the recompressed set of data, the processor is configured to store the recompressed set of data in the memory utilizing the header reader.

12. The system of claim 9, wherein each subsequent JPEG data block in the set of data comprises the compression scheme information and the block-image synchronization information from a previous JPEG data block.

13. The system of claim 9, wherein the set of data comprises a re-compressor and wherein, when storing the recompressed set of data, the processor is configured to store the recompressed set of data utilizing the re-compressor.

14. The system of claim 9, wherein the set of data comprises a decompression coordinator and wherein, when storing the recompressed set of data, the processor is configured to store the recompressed set of data utilizing the decompression coordinator.

15. The system of claim 9, wherein the set of data comprises two of a header reader, a re-compressor, and a decompression coordinator and wherein, when storing the recompressed set of data, the processor is configured to store the recompressed set of data utilizing the two of the header reader, the re-compressor, and the decompression coordinator.

16. The system of claim 9, wherein the set of data comprises a header reader, a re-compressor, and a decompression coordinator and wherein, when storing the recompressed set of data, the processor is configured to store the recompressed set of data utilizing each of the header reader, the re-compressor, and the decompression coordinator.

17. A computer program product for recompressing previously compressed data by a processor, the computer program product including a non-transitory computer-readable storage medium comprising:
computer code for receiving, by the processor, a set of data;
computer code for determining if the set of data is JPEG data, the JPEG data comprising:
a plurality of JPEG data blocks,
a JPEG header block, and compression scheme information and block-image synchronization information stored in the JPEG header block and in each JPEG data block;
computer code for recompressing the JPEG data utilizing the compression scheme information and the block-image synchronization information if the set of data is JPEG data; and
computer code for storing the recompressed JPEG data.

18. The computer program product of claim 17, further comprising computer code for storing the set of data if the set of data is not JPEG data.

19. The computer program product of claim 17, wherein the set of data comprises a header reader and wherein the computer code for storing the recompressed set of data comprises computer code for storing the recompressed set of data utilizing the header reader.

20. The computer program product of claim 17, wherein each subsequent JPEG data block in the set of data comprises the compression scheme information and the block-image synchronization information from a previous JPEG data block.

21. The computer program product of claim 17, wherein the set of data comprises a re-compressor and wherein the computer code for storing the recompressed set of data comprises computer code for storing the recompressed set of data utilizing the re-compressor.

22. The computer program product of claim 17, wherein the set of data comprises a decompression coordinator and wherein the computer code for storing the recompressed set of data comprises computer code for storing the recompressed set of data utilizing the decompression coordinator.

23. The computer program product of claim 17, wherein the set of data comprises two of a header reader, a re-compressor, and a decompression coordinator and wherein storing the recompressed set of data comprises storing the recompressed set of data utilizing the two of the header reader, the re-compressor, and the decompression coordinator.

24. The computer program product of claim 17, wherein the set of data comprises a header reader, a re-compressor, and a decompression coordinator and wherein the computer code for storing the recompressed set of data comprises computer code for storing the recompressed set of data utilizing each of the header reader, the re-compressor, and the decompression coordinator.

* * * * *